(12) United States Patent
Natt et al.

(10) Patent No.: US 8,467,033 B2
(45) Date of Patent: Jun. 18, 2013

(54) METHOD FOR OPERATING AN ILLUMINATION SYSTEM OF A MICROLITHOGRAPHIC PROJECTION EXPOSURE APPARATUS

(75) Inventors: Oliver Natt, Aalen (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 202 days.

(21) Appl. No.: 12/853,971

(22) Filed: Aug. 10, 2010

(65) Prior Publication Data

US 2010/0321661 A1 Dec. 23, 2010

Related U.S. Application Data

(63) Continuation of application No. PCT/EP2009/000861, filed on Feb. 7, 2009.

(60) Provisional application No. 61/031,045, filed on Feb. 25, 2008.

(30) Foreign Application Priority Data

Feb. 25, 2008 (DE) .......................... 10 2008 011 501

(51) Int. Cl.
*G03B 27/54* (2006.01)
*G03B 27/72* (2006.01)
*G03B 27/32* (2006.01)
*G03F 7/20* (2006.01)

(52) U.S. Cl.
CPC ........ *G03F 7/70091* (2013.01); *G03F 7/70125* (2013.01); *G03F 7/70141* (2013.01)
USPC ................................. 355/67; 355/71; 355/77

(58) Field of Classification Search
CPC G03F 7/70091; G03F 7/70125; G03F 7/70141

USPC .............................................. 355/67, 71, 77
See application file for complete search history.

(56) References Cited

U.S. PATENT DOCUMENTS

| 5,867,319 A | * | 2/1999 | Sugiyama et al. | ............. 359/618 |
| 6,285,442 B1 | * | 9/2001 | Sato | ................................ 355/67 |

(Continued)

FOREIGN PATENT DOCUMENTS

| EP | 1 336 893 | 8/2003 |
| EP | 1 564 593 | 8/2005 |
| WO | WO 2008/092653 | 8/2008 |

OTHER PUBLICATIONS

T. Heil et al., "Predictive modeling of advanced illumination pupils used as imaging enhancement for low k1 applications," Proc. of the SPIE, vol. 5377, No. 1, 2004, pp. 344-356.

(Continued)

*Primary Examiner* — Toan Ton
*Assistant Examiner* — Steven H Whitesell Gordon
(74) *Attorney, Agent, or Firm* — Fish & Richardson P.C.

(57) ABSTRACT

A method of operating an illumination system of a microlithographic projection exposure apparatus is provided. A set of illumination parameters that describe properties of a light bundle which converges at a point on a mask to be illuminated by the illumination system is first determined. Optical elements whose optical effect on the illumination parameters can be modified as a function of control commands are furthermore determined, as well as sensitivities with which the illumination parameters react to an adjustment of the optical elements, induced by the control commands. The control commands are then determined while taking the previously determined sensitivities into account, such that deviations of the illumination parameters from predetermined target illumination parameters satisfy a predetermined minimization criterion. These control commands are applied to the optical elements, before the mask is illuminated.

38 Claims, 10 Drawing Sheets

U.S. PATENT DOCUMENTS

| | | | |
|---|---|---|---|
| 6,368,763 B2 * | 4/2002 | Dirksen et al. | 430/30 |
| 6,535,274 B2 | 3/2003 | Antoni | |
| 2001/0053489 A1 * | 12/2001 | Dirksen et al. | 430/30 |
| 2004/0239904 A1 | 12/2004 | Nishinaga | |
| 2008/0024874 A1 * | 1/2008 | Uitterdijk et al. | 359/649 |

OTHER PUBLICATIONS

The International Search Report for PCT/EP2009/000861, dated Jul. 17, 2009.

* cited by examiner

METHOD FOR OPERATING AN ILLUMINATION SYSTEM OF A MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2009/000861, filed Feb. 7, 2009, which claims benefit of German Application No. 10 2008 011 501.0, filed Feb. 25, 2008 and U.S. Ser. No. 61/031,045, filed Feb. 25, 2008. International application PCT/EP2009/000861 is hereby incorporated by reference in its entirety.

FIELD

The disclosure relates to microlithographic projection exposure apparatus, such as are used for the production of large-scale integrated electrical circuits and other microstructured components. The disclosure relates in particular to methods for operating an illumination system of such a microlithographic projection exposure apparatus.

BACKGROUND

Integrated electrical circuits and other micro structured components are conventionally produced by applying a plurality of structured layers onto a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A pattern of diffracting structures, which is arranged on a mask, is thereby imaged onto the photoresist with the aid of a projection objective. Since the imaging scale is generally less than 1, such projection objectives are often also referred to as reducing objectives.

After the photoresist has been developed, the wafer is subjected to an etching process so that the layer becomes structured according to the pattern on the mask. The remaining photoresist is then removed from the other parts of the layer. This process is repeated until all the layers have been applied onto the wafer.

The performance of the projection exposure apparatus being used is determined not only by the imaging properties of the projection objective, but also by an illumination system which illuminates the mask. To this end, the illumination system contains a light source, for example a laser operated in pulsed mode, and a plurality of optical elements which generate light bundles, converging on the mask at field points, from the light generated by the light source. The individual light bundles have particular properties, which in general are adapted to the projection objective.

These properties include inter alia the illumination angle distribution of the light bundles which respectively converge on a point in the mask plane. The term illumination angle distribution describes the way in which the overall intensity of a light bundle is distributed between the different directions in which the individual rays of the light bundle strike the relevant point in the mask plane. If the illumination angle distribution is specially adapted to the pattern contained in the mask, then the latter can be imaged with high imaging quality onto the wafer covered with photoresist.

The illumination angle distribution is often described not directly in the mask plane, in which the mask to be projected is placed, but instead as an intensity distribution in a generalised pupil or a real pupil surface, which has a Fourier relation with the mask plane. The generalised pupil corresponds to an exit pupil lying at infinity, whereas a real pupil surface is distinguished in that the principal rays of the ray bundles intersect the optical axis there. Description of the illumination angle distribution (angle space) with the aid of an intensity distribution (position space) utilises the fact that each angle with respect to the optical axis, at which a light ray passes through a field plane, can be assigned a radial distance measured from the optical axis in a Fourier-transformed pupil surface. Similar considerations also apply to a generalised pupil. For the sake of simplicity, in what follows the description of the illumination angle distribution will refer to the intensity distribution in a real pupil surface, unless expressly indicated otherwise.

The illumination angle distribution, or the intensity distribution equivalent thereto in a pupil surface or idealised exit pupil, will sometimes also be referred to as an "illumination setting". Depending on the basic shape of the intensity distribution, distinction is made between so-called conventional and unconventional illumination settings.

In the case of conventional illumination settings, the intensity distribution in a pupil surface has the shape of a circular disc concentric with the optical axis. Each point in the mask plane is therefore struck by light rays at angles of incidence of between 0° and a maximum angle dictated by the radius of the circular disc. In the case of unconventional illumination settings, which include in particular ring-field illuminations and multi-pole illuminations, the region illuminated in the pupil surface has the shape of a ring concentric with the optical axis, or a plurality of individual regions (poles) which are arranged at a distance from the optical axis. With these settings, therefore, the mask to be projected is only illuminated obliquely. In the case of dipole illumination, for example, two poles are arranged on a radius with an equal radial distance from the optical axis. The intensity distribution for quadrupole illumination is obtained as a superposition of two dipole illuminations mutually rotated by 90°.

The operators of projection exposure apparatus generally establish a target illumination angle distribution, which is regarded as particularly suitable for imaging a particular mask optimally with the aid of a projection objective onto a photoresist or another photosensitive layer. The task is then to adjust the illumination system so that the target illumination distribution is achieved with the greatest possible accuracy in the mask plane. To this end, illumination systems generally include a plurality of adjustable optical elements whose optical effect on the illumination angle distribution can be modified as a function of control commands. These optical elements may for example be replaceable diffractive optical elements, zoom objectives and/or pairs of axicon elements. Additional measures are furthermore often provided, by which fine tuning or correction of the illumination angle distribution can be achieved. In this context, for example, U.S. Pat. No. 6,535,274 B2 proposes adjustable transmission filters which are arranged in or in the immediate vicinity of the pupil surface.

The greater the number of optical elements, whose effect on the illumination angle distribution can be modified as a function of control commands, the more difficult it is to determine the control commands so that the illumination angle distribution actually set up corresponds as much as possible to the target illumination angle distribution. This problem is encountered above all when new types of illumination angle distributions are intended to be set up, for which there is not yet any experience as to the control commands with which the new type of illumination angle distribution can be achieved.

To date, attempts have been made to describe the illumination angle distribution for the various illumination settings with the aid of relatively simple models. Various quantities have been defined, which can be deliberately influenced with the aid of particular optical elements, for example filter elements arranged near the pupil. In the case of conventional, annular or quadrupole illumination settings, for example, a quantity referred to as the pupil ellipticity is often employed. Simply speaking, the pupil ellipticity corresponds to the ratio of the amounts of light which strike a field point on the mask from orthogonal directions during exposure. The greater the pupil ellipticity deviates from 1, the more asymmetric is the illumination angle distribution.

Another quantity, which has to date been employed for describing illumination angle distributions, is the telecentricity. Illumination is referred to as energetically telecentric when the energetic central rays of the light bundles, which are often also referred to as centroid rays, pass perpendicularly through the mask plane. Similar considerations apply to the geometrical telecentricity, for which it is not the energetic but the geometrical central rays (i.e. principal rays) of the light bundles which are considered.

In the case of energetically non-telecentric illumination, the entire light bundles strike the mask to some extent obliquely. For the illumination angle distribution, this means that the amounts of light coming from opposite directions are of different size. In general, telecentric illumination is desired since the projection objectives are usually likewise telecentric on the object side.

Such quantities, however, sometimes cannot be used expediently for all illumination settings. Above all, these quantities generally do not allow the intensity distribution in the pupil surface (and therefore the illumination angle distribution in the mask plane) to be described so accurately that the intensity distribution could be reconstructed based on these quantities.

An article by T. Heil et al. entitled "*Predictive modeling of advanced illumination pupils used as imaging enhancements for low-k1 applications*", Optical Microlithography XVII, B. W., Smith, ed., Proc SPIE 5377, pages 344-356, SPIE, March 2004 discloses a parametric pupil model with which annular illumination settings can be described very precisely. With the aid of a relatively limited number of pupil parameters, it is possible to describe ring-shaped intensity distributions in a pupil surface so accurately that the intensity distribution can be reconstructed merely based on the illumination parameters. This article does not, however, address the question of how control commands are to be determined for adjustable optical elements, so that a desired target illumination angle distribution is achieved in the mask plane.

SUMMARY

The disclosure provides a method for operating an illumination system of a microlithographic projection exposure apparatus which makes it possible to determine the control commands for optical elements to try to set the properties of a light bundle, which converges at a point on a mask to be illuminated by the illumination system, to be the properties specified by a target illumination angle distribution.

The disclosure provides a method that includes:
a) determining a set of illumination parameters that describe properties of a light bundle which converges at a point on a mask to be illuminated by the illumination system, wherein the properties of the light bundle include an intensity distribution which the light bundle has in an exit pupil associated to the point, the intensity distribution being described as a perturbation of an ideal intensity distribution;
b) determining optical elements whose optical effect on the illumination parameters can be modified as a function of control commands;
c) for each optical element, determining sensitivities with which the illumination parameters react to an adjustment, which is induced by the control commands, of the respective optical element;
d) specifying a set of target illumination parameters;
e) determining the control commands, while taking into account the sensitivities determined in step c), such that deviations of the illumination parameters from the target illumination parameters satisfy a predetermined minimisation criterion;
f) applying the control commands determined in step e) to the optical elements;
g) illuminating the mask.

The disclosure also provides a method for evaluating properties of a light bundle which converges at a point on a mask to be illuminated by an illumination system in a microlithographic projection exposure apparatus.

The disclosure provides a method that includes:
a) measuring an intensity distribution in an exit pupil of the illumination system, which is assigned to the point;
b) at least approximately describing the intensity distribution measured in step a) as a perturbation of an ideal intensity distribution, the perturbation being described as a combination of an intensity modulation and a distortion, and wherein
  i) the intensity modulation is described by a linear superposition of functions of a first complete, optionally orthogonal function system and
  ii) the distortion is described by linear superposition of vector modes of a complete, optionally orthogonal second function system;
c) evaluating the properties of the light bundle based on scalar superposition coefficients of the linear superpositions.

Such evaluation may also be helpful in the production of an illumination system. The disclosure provides a production method that includes:
  compiling a design for the illumination system;
  evaluating the properties of a light bundle according to the evaluation method indicated above;
  determining a quality function to which at least one of the superposition coefficients determined in step b) contributes;
  compiling a modified design such that the quality function is improved.

By additional adjustment steps after production and before delivery, an illumination system may be improved further in respect of the properties of a light bundle which converges at a point on a mask to be illuminated by the illumination system. To this end, the following steps may be provided:
  evaluating properties of a light bundle according to the evaluation method indicated above;
  modifying the properties such that the evaluation is improved.

The disclosure further provides a microlithographic projection exposure apparatus which makes it possible to determine control commands for optical elements of an illumination system to try to set the properties of a light bundle, which converges at a point on a mask to be illuminated by the illumination system, to be the properties specified by a target illumination angle distribution.

The disclosure provides a projection exposure apparatus having:
- an illumination system which contains a plurality of optical elements whose optical effect on the illumination parameters can be modified as a function of control commands,
- a measuring instrument for measuring an intensity distribution in an exit pupil which is assigned to a point that lies in an illumination plane, in which a mask to be illuminated can be arranged, and at which a light bundle converges,
- a computer by which is configured
    (i) to determine, for each optical element, sensitivities with which illumination parameters, which describe properties of the light bundle, react to an adjustment, which is induced by the control commands, which is induced by the control commands, of the respective optical element, wherein the properties of the light bundle include an intensity distribution which the light bundle has in an exit pupil associated to the point, the intensity distribution being described as a perturbation of an ideal intensity distribution, and wherein the computer is further configured
    (ii) to control commands can be determined while taking the previously determined sensitivities into account, such that deviations of the illumination parameters from the target illumination parameters satisfy a pre-determined minimisation criterion;
- a data transfer path via which the control commands determined by the computer can be applied to the optical elements.

The disclosure furthermore relates to a method for configuring a mask which is intended to be illuminated by an illumination system in a microlithographic projection exposure apparatus and imaged onto a photosensitive layer by a projection objective. According to the disclosure, such a method includes the following steps:

a) evaluating properties of a light bundle which converges at a point on the mask to be illuminated by the illumination system in the microlithographic projection exposure apparatus, according to the evaluation method indicated above;

b) determining structures contained on the mask while taking the superposition coefficients into account, so as to reduce undesired effects on the imaging of the mask which are caused by at least one non-zero superposition coefficient.

BRIEF DESCRIPTION OF THE DRAWINGS

Other features and advantages of the disclosure may be found in the following description of an exemplary embodiment with reference to the drawing, in which.

DETAILED DESCRIPTION

1. Structure of a Projection Exposure Apparatus

Figure 1:
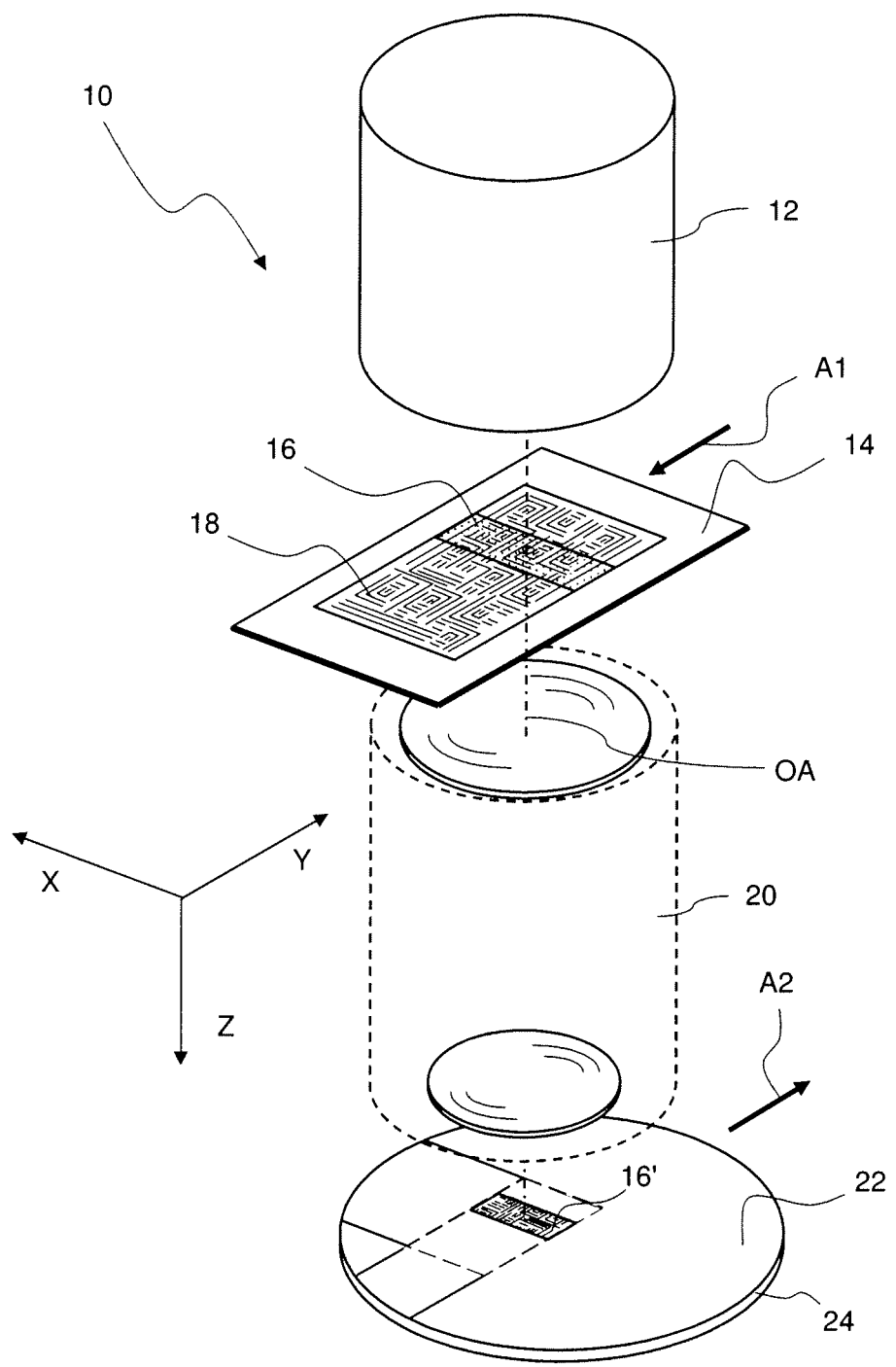
FIG. 1 shows a highly simplified perspective representation of a microlithographic projection exposure apparatus.

FIG. 1 shows a highly schematised perspective representation of a projection exposure apparatus 10, which is suitable for the lithographic production of microstructured components. The projection exposure apparatus 10 contains an illumination system 12 that illuminates a narrow illumination field 16, which is rectangular in the exemplary embodiment represented, on a mask 14. Other illumination field shapes, for example ring segments, may of course likewise be envisaged.

Structures 18 lying inside the illumination field 16 on the mask 14 are imaged with the aid of a projection objective 20 onto a photosensitive layer 22. The photosensitive layer 22, which may for example be a photoresist, is applied on a wafer 24 or another suitable substrate and lies in the image plane of the projection objective 20. Since the projection objective 20 generally has an imaging scale $|\beta|<1$, the structures 18 lying inside the illumination field 16 are imaged in a reduced fashion as region 16'.

In the projection exposure apparatus 10 represented, the mask 14 and the wafer 24 are displaced along a direction denoted by Y during the projection. The ratio of the displacement speeds is equal to the imaging scale $\beta$ of the projection objective 20. If the projection objective 20 generates inversion of the image (i.e. $\beta<0$), then the displacement movements of the mask 14 and the wafer 22 will be in opposite directions as is indicated by arrows A1 and A2 in FIG. 1. In this way, the illumination field 16 is guided in a scanning movement over the mask 14 so that even sizeable structured regions can be projected coherently onto the photosensitive layer 22.

2. Structure of an Illumination System

Figure 2:
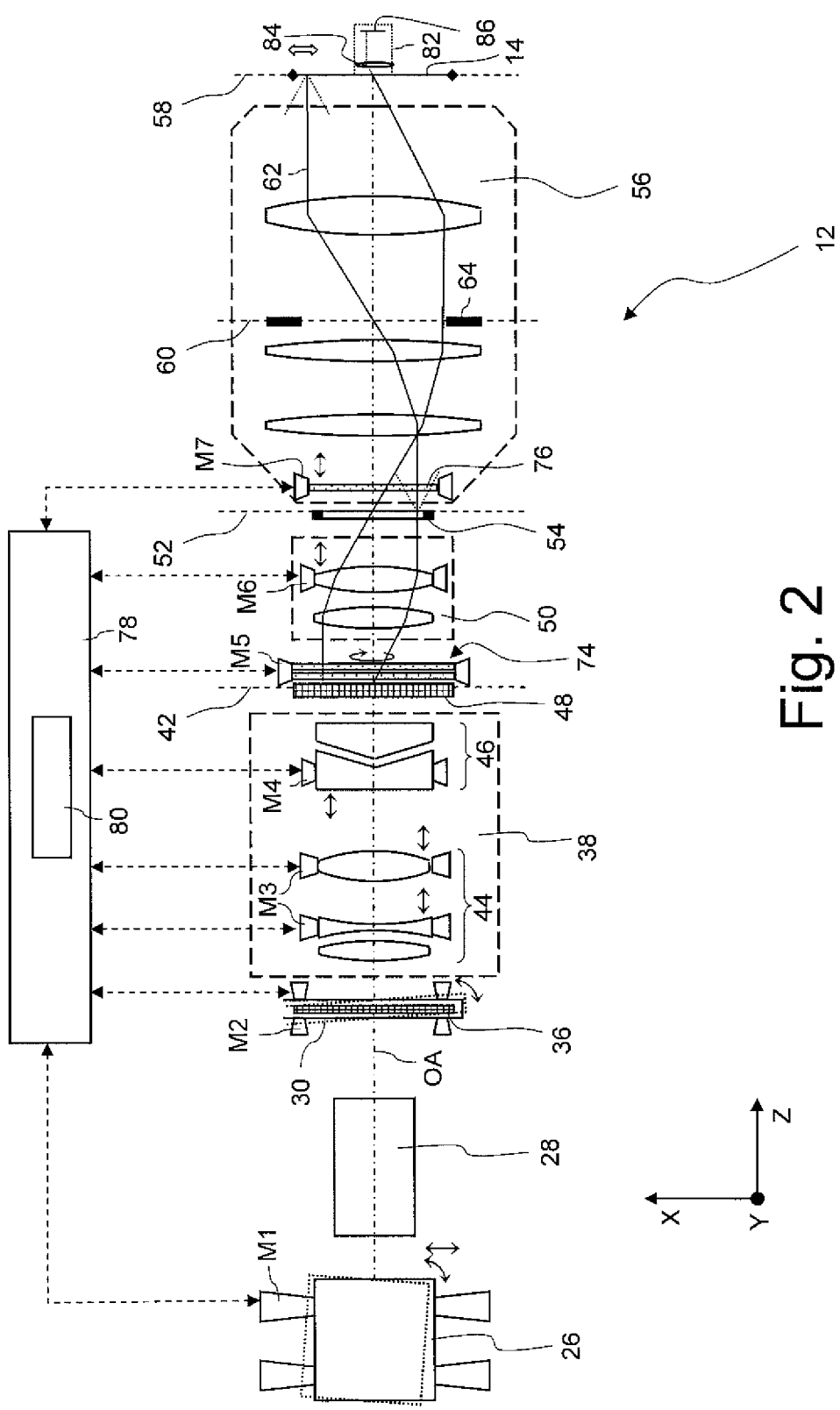
FIG. 2 shows a meridian section through an illumination system of the projection exposure apparatus shown in FIG. 1, according to a first exemplary embodiment.

FIG. 2 shows details of the illumination system 12 in a simplified meridian section which is not true to scale. The illumination system 12 contains a light source 26, which generates projection light. In the exemplary embodiment described here, the light source 26 is an excimer laser with which light in the (deep) ultraviolet spectral range can be generated. The use of short-wave projection light is advantageous because a high resolution can thereby be achieved for the optical imaging. Excimer lasers with the laser media KrF, ArF or $F_2$, by which light with the wavelengths 248 nm, 193 nm and 157 nm can respectively be generated, are conventional.

The light generated by the excimer laser used as a light source 26 is highly collimated and diverges only weakly. It is therefore initially expanded in a bundle expander 28. The bundle expander 28 may for example be an adjustable mirror arrangement, which increases the dimensions of the approximately rectangular light bundle cross section.

The expanded light bundle subsequently passes through a diffractive optical element 36, held in an exchange holder 30, and a zoom-axicon module 38, which together illuminate a first pupil surface 42 of the illumination system. The zoom-axicon module 38 includes a zoom objective denoted by 44 and an axicon group 46, which contains two axicon elements with conical and mutually complementary faces. With the aid of the axicon group 46, the radial light distribution can be modified so as to achieve ring-shaped illumination of the first pupil surface 42. By adjusting the zoom objective 44, it is possible to modify the diameter of the regions illuminated in the first pupil surface 42. The zoom-axicon module 38 therefore makes it possible to set up various conventional and annular illumination settings.

In order to set up multi-pole illumination settings, in the illumination system represented, a diffractive optical element 36 is inserted into the exchange holder 30. The structures on the diffractive optical element 36 are arranged so that the desired multi-pole intensity distribution is generated in the far-field.

An optical integrator 48, which may for example be an arrangement of microlens arrays, is arranged in or in the immediate vicinity of the first pupil surface 42. The optical integrator generates secondary light sources in its focal plane on the image side, each of which emits a divergent light bundle with an angle spectrum dictated above all by the geometry of the microlenses. By a condenser 50, the light bundles generated by the secondary light sources are superimposed in an intermediate field plane 52 so that it is illuminated very homogeneously. The condenser 50 establishes a Fourier relation between the first pupil surface 42 and the intermediate field plane 52. All light rays coming from the first pupil surface 42 at the same angle therefore arrive at the same point in the intermediate field plane 52, whereas all light rays coming from a particular point in the first pupil surface 42 pass through the intermediate field plane 52 at the same angle.

In the exemplary embodiment represented, a field diaphragm 54, which may for example include a plurality of adjustable blades and/or a multiplicity of narrow finger-like diaphragm elements that can be inserted independently of one another into the light path, is arranged in the intermediate field plane 52. With the aid of a field diaphragm objective 56, the intermediate field plane 52 is optically conjugated with a mask plane 58 in which the mask 14 is arranged. The mask plane 58 is both the image plane of the field diaphragm objective 56 and the object plane of the subsequent projection objective 20.

The field diaphragm objective 56 contains a second pupil surface 60 of the illumination system 12, in which an aperture diaphragm 64 may be arranged in order to (additionally) restrict the numerical aperture of the illumination system 12 on its image side.

3. Illumination Angle Distribution

The illumination system 12 allows the properties of light bundles, which respectively converge at points on the mask 14 to be illuminated by the illumination system 12, to be established with high accuracy. These properties are, on the one hand, the overall intensity with which the light bundles strike the mask 14. Uncontrolled variations in the overall intensity of the individual light bundles can lead to undesired variations in the width of the structures which are generated on the wafer 24.

It is not however the overall intensity which will be the centre of attention in what follows, but instead a property of the light bundles which is referred to as the illumination angle distribution. The term "illumination angle distribution" describes the way in which the overall intensity of a light bundle is distributed between the different directions along which the individual rays of the light bundle strike a point on the mask. What this means will be explained below with reference to FIG. 3.

Figure 3:
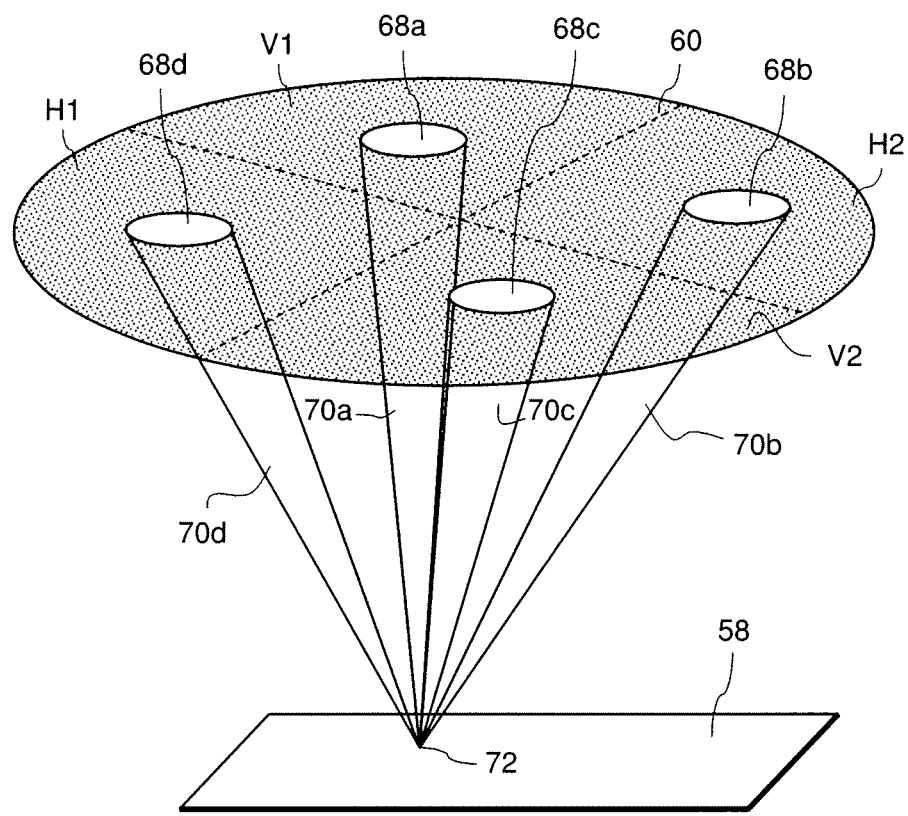
FIG. 3 shows a perspective representation of a plurality of light bundles emerging from a pupil surface.
Figure 3:
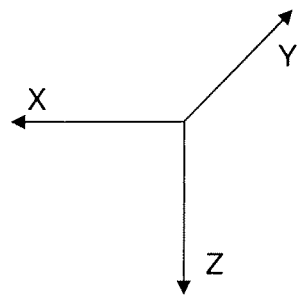

FIG. 3 shows, in a perspective schematic representation, the pupil surface 60 of the field diaphragm objective 56 as well as a detail of the mask plane 58. For this representation, it is assumed that quadrupole illumination is being generated by the illumination system 12. As already mentioned above, to this end the diffractive optical element 36 may be configured so that four poles are illuminated in the first pupil surface 42. Since the basic shape of the illumination angle distribution is not changed by the optical elements arranged between the first pupil surface 42 and the second pupil surface 60, four poles are also illuminated in the pupil surface 60 of the field diaphragm objective 56, which are denoted by 68a, 68b, 68c and 68d in FIG. 3. The light sub-bundles which illuminate the poles 68a to 68d are denoted by 70a, 70b, 70c and 70d, respectively and they converge at a field point 72 in the mask plane 58. All the light sub-bundles 70a to 70d therefore contribute to the intensity at the field point 72.

In quadrupole illumination, it is generally desirable that all the light sub-bundles 70a to 70d should contribute in the same way to the intensity at the field point 72. Only this will ensure that strip-like structures in the mask 14, which have equal widths but different orientations (vertical or horizontal), are also imaged with equal widths onto the photosensitive layer 22. If the contributions of the light sub-bundles 70a and 70c are greater or less than the contributions of the light bundles 70b and 70d, then for example the situation may arise that horizontally oriented structures are projected onto the photosensitive layer 22 with a greater width than vertically oriented structures, even though in both cases the structures have equal widths in the mask 14.

In order to be able to describe the intensity distribution on the four poles 68a to 68d, especially in the case of quadrupole illumination, to date the pupil surface 60 (or more accurately the exit pupils assigned to the individual mask points, more details below) is divided into quadrants V1, V2, and H1, H2 in which a pole 68a to 68d is respectively arranged. The mutually opposite quadrants V1, V2, and H1, H2 then contain a pair of poles, the light of which leads only to the imaging of structures with a particular structure direction. By specifying the intensity of the light passing through the quadrants V1, V2 and H1, H2, it is therefore possible to draw conclusions as to whether the light fractions which lead to the imaging of structures extending mutually orthogonally are equal or not. This ratio is referred to as the pupil ellipticity E, and it can be used as a parameter for describing a property of the illumination angle distribution. In the case of quadrupole illumination, however, it will generally be desirable to employ further illumination parameters in order to describe the illumination angle distribution.

For other basic shapes of intensity distributions in pupil surfaces of the illumination system 12, for instance in the case of conventional, annular or dipole illumination settings, it is likewise desirable to find illumination parameters which allow simple but nevertheless maximally complete description of the intensity distribution. A set of illumination parameters suitable for annular illumination settings is specified in the article by T. Heil et al. which was mentioned in the introduction. There, the intensity distribution is described with the aid of a parameter-based pupil model in which some of the parameters describe an ideal ring-shaped intensity distribution and the other parameters relate to perturbations, i.e. deviations from this ideal intensity distribution. Below, in section 6.2, a new pupil model will also be explained which allows very accurate description of illumination angle distributions irrespective of any particular basic shape of an intensity distribution in a pupil surface.

4. Influencing the Illumination Angle Distribution

In order to be able to adjust the illumination angle distribution, the illumination system 12 includes a plurality of adjustable optical elements whose optical effect on the illumination angle distribution, and therefore on the illumination parameters used to describe it, can be modified as a function of control commands. In general the modified effect will be due to a position change of the relevant optical element, for example displacements, rotations or tilts, induced with the aid of manipulators. Material properties may also be used instead of position changes, for example the refractive index by applying an electrical voltage (electro-optical effect). Those optical elements of the illumination system 12 with which the illumination angle distribution can be adjusted, will be explained briefly below in sequence in the light path.

With the aid of first manipulators M1, as indicated by small arrows, the light source 26 can be displaced in translation perpendicularly to the optical axis OA and/or tilted about a tilt axis extending perpendicularly to the optical axis OA. Tilting changes the direction of the light rays which strike the diffractive optical element 36. Owing to this different illumination, the angle distribution generated by the diffractive optical element 36 also changes. Overall, displacing the light source 26 in translation perpendicularly to the optical axis OA shifts the intensity distribution in the pupil surfaces 42 and 60.

The exchange holder 30 for the diffractive optical element 36 can furthermore be tilted about a tilt axis extending perpendicularly to the optical axis OA with the aid of second manipulators M2, as is likewise indicated by a small arrow. The effect on the illumination angle distribution due to this differs from that which is generated by tilting the light source 26.

The zoom objective 44, with which the intensity distribution in the first pupil surface 42 can be varied by modifying the focal length of the zoom objective 44, is particularly important for adjustment of the illumination angle distribution. To this end, the zoom objective 44 includes two third manipulators M3 working together, with which the axial position of at least two lenses of the zoom objective 44 can be modified.

With the aid of the axicon group 46, different annular intensity distributions can be generated in the first pupil surface 42 as already explained above in 2. The distance between the two axicon elements of the axicon group 46 can be modified by a fourth manipulator M4, and has an effect on the ring diameter as well as the ring width of the annular intensity distribution.

In or in the immediate vicinity of the first pupil surface 42, the pupil filter 74 is arranged which contains two filter elements that can be rotated relative to one another (see arrow). The relative rotation setting of the two filter elements can be modified with the aid of a fifth manipulator M5. Details regarding the pupil filter 74 may be found in U.S. Pat. No. 6,535,274 B2, which has already been mentioned above. The filter elements of the pupil filter 74 are designed as transmission filters which, in some exemplary embodiments, include grey filter regions in the form of circle segments. With such filters the illumination angle distribution can be corrected field-independently, i.e. with the same effect over the entire mask 14, within certain limits.

In the illumination system 12, in order to adjust the illumination angle distribution, a sixth manipulator M6 is furthermore provided with which one or more lenses inside the condenser 50 can be displaced in an axial direction. Deviations from the sine condition can deliberately be induced by such a displacement, so that the relation between positions in the first pupil surface 42 on the one hand, and angles in the subsequent intermediate field plane 52 on the other hand, can be modified.

Behind the intermediate field plane 52, an intermediate filter 76 is arranged which is likewise designed as a transmission filter, although it is arranged neither in a pupil surface nor in a field plane in its axial position. Owing to this arrangement, the intermediate filter 76 influences the illumination angle distribution field-dependently i.e. the effect on the illumination angle distribution differs for different points on the mask 14. Undesired effects on the intensity distribution on the mask 14 may be compensated for by additional measures. Details regarding the intermediate filter 76 may be found from WO 2008/092653 A assigned to the Applicant. This also describes multi-part intermediate filters 76, in which individual parts of the intermediate filter 76 can be displaced with the aid of a seventh manipulator M7 so that the field-dependent effect on the illumination angle distribution can be modified within certain limits, without this affecting the intensity distribution. The seventh manipulator M7 may also be designed so that it can extract the intermediate filter 76 fully from the bundle path.

The manipulators M1 to M7 are connected via signal lines (represented by dashes) to a control unit 78 by which the individual manipulators M1 to M7 can be driven in a controlled fashion. To this end, the control unit 78 includes a computer 80 which, according to a method explained below, ascertains the control commands which are applied to the manipulators M1 to M7 so that the illumination system 12 generates a desired target illumination angle distribution in the mask plane 58.

5. Method for Determining the Control Commands

A first exemplary embodiment of a method, with which the desired illumination angle distribution in the mask plane 58 can be generated by suitable driving of the manipulators M1 to M7, will be described below with the aid of the flowchart shown in FIG. 4 and the diagram of FIG. 5. The method is based on an adjustment algorithm in which properties of light bundles, namely in particular the illumination angle distribution, can be described with the aid of illumination parameters. With the aid of a minimisation criterion, control commands for the manipulators M1 to M7 are determined such that the actual illumination parameters approximate predetermined target illumination parameters. The essential method steps will first be described at length; other exemplary embodiments of such a method will be explained further below in section 6.

(a) Determining the Illumination Parameters

In a first step S1 a set of illumination parameters is determined, which describe properties of the light bundles that converge at points on the mask 14 to be illuminated by the illumination system 12. As already mentioned in 4, to this end it is possible to use different pupil models with which the illumination angle distribution in a pupil surface can be described parametrically.

The illumination parameters not only must be suitable for describing the properties of the illumination angle distribution, but should also be acquirable via measurements (at least indirectly). A measurement of the illumination angle distribution is conventionally carried out by introducing an angle-resolving sensor 82 (see FIG. 2), which measures the illumination angle distribution at a selected point in the mask plane 58, or in the image plane of the projection objective. To this end, the sensor 82 may contain a condenser 84 which converts the angle distribution at the selected point into a position distribution in a plane, in which a position-resolving 2D sensor 86 is arranged.

Ideally the illumination parameters should be determined so that they can be input quantities of a simulation program, with which the dimensions of images of the structures 18 contained on the mask 14 can be calculated. The pupil ellipticity E is such a quantity, since with knowledge of this quantity and further boundary conditions (imaging properties of the projection objective, illumination threshold of the photosensitive layer 22 etc.) it is possible to calculate how greatly the dimensions of structures, which per se are of the same type but extend mutually orthogonally, will differ from one another in the event of a pupil ellipticity E≠1.

In what follows, it will be assumed that m illumination parameters $p_1, \ldots, p_m$ are determined, which represent components of a vector $\vec{p}$ that combines the set of illumination parameters.

(b) Determining the Adjustable Optical Elements

In a second step S2, those adjustable optical elements are determined whose optical effect on the illumination parameters can be modified as a function of control commands. In the illumination system 12, this selection is established by the manipulators M1 to M7.

The control commands which are assigned to the individual manipulators, and which respectively lead to a particular adjustment of the relevant manipulator, will be denoted as $x_1, \ldots, x_n$, where n is less than or equal to the total number of manipulators. The set of control commands $x_1, \ldots, x_n$ will be combined to form a vector $\vec{x}$.

(c) Determining the Sensitivities

For determining the control commands, it will be assumed that the control commands $x_1, \ldots, x_n$ act approximately linearly according to equation Eq. (1)

$$\begin{pmatrix} x_1 \\ \vdots \\ x_n \end{pmatrix} \cdot \begin{pmatrix} s_{11} & \cdots & s_{1m} \\ \vdots & \ddots & \vdots \\ s_{n1} & \cdots & s_{nm} \end{pmatrix} = \begin{pmatrix} p_1 \\ \vdots \\ p_m \end{pmatrix} \quad (1)$$

or in matrix vector notation $$\vec{x} \cdot \vec{S} = \vec{p}$$

on the illumination parameters $p_1, \ldots, p_m$. The matrix $\vec{S}$ contains sensitivities $s_{ij}$, which describe how the control commands affect the various illumination parameters $p_1, \ldots, p_m$. The sensitivity matrix $\vec{S}$ is now determined in a step S3 by simulation or by measurement.

Determination by simulation may, for example, be carried out by only the control commands assigned to a particular manipulator being varied and ascertaining by simulation how the changes affect the various illumination parameters $p_1, \ldots, p_m$. For determination by measurement a similar procedure may be adopted, i.e. a manipulator is driven with different control commands and the illumination angle distribution obtained for one field point or a multiplicity of field points is respectively acquired by measurement techniques. The illumination parameters $p_1, \ldots, p_m$ are then derived from the measured illumination angle distribution according to the pupil model being employed.

(d) Specifying the Target Illumination Parameters

In a step S4 target illumination parameters are specified, which describe the target illumination angle distribution to be set up in the mask plane 58. The set of target illumination parameters will be denoted below as the vector $\vec{p}_0$.

(e) Determining the Control Commands

In a further step S5 a set $\vec{x}$ of control commands is determined, while taking into account the sensitivities determined in step S3, such that deviations of the set $\vec{p}$ from the set $\vec{p}_0$ of target illumination parameters satisfy a predetermined minimisation criterion. In the simplest case, the expression $$\|\vec{x} \cdot \vec{S} - \vec{p}\| \quad (2)$$

is minimised, where $\|\cdot\|$ denotes the conventional Euclidean 2-norm. Linear algebra provides a range of solution methods for solving the minimisation problem. One conventional method is to determine the pseudo-inverses via singular value decomposition. If the control commands $\vec{x}$ are selected so that, taking the sensitivity matrix $\vec{S}$ into account, they lead to an illumination angle distribution in the mask plane 58 which is described by the target parameters $\vec{p}_0$, then this expression according to (2) is identically 0.

Weighting

Depending on the basic shape of the intensity distribution in a pupil surface (for example circular disc-shaped, ring-shaped or arrangement of a plurality of poles), it may be expedient for certain illumination parameters to be taken into account differently in the minimisation described above. If one of the illumination parameters is for example the pupil ellipticity already explained above with the aid of FIG. 3, then this quantity makes little sense for dipole illuminations. This illumination parameter in dipole illumination could therefore be reduced in its weighting or even remain entirely neglected by a weighting factor of 0.

If the illumination parameters $p_1, \ldots, p_m$ are weighted with weighting factors $w_1, \ldots, w_m$, then the expression to be minimised becomes $$\|\vec{w}^T \cdot (\vec{x} \cdot \vec{S} - \vec{p})\| \quad (3)$$

where the vector $\vec{w}$ has the weighting factors $w_1, \ldots, w_m$ as components. Further details regarding the dependency of the weighting factors $w_1, \ldots, w_m$ on the basic illumination shape may be found below in section 6.3.

Properties of the mask 14 to be illuminated may moreover also be taken into account by the weighting factors $w_1, \ldots, w_m$. In the case of a mask which only contains structures extending along one structure direction, certain illumination parameters, for example the pupil ellipticity, may be irrelevant for the image finally obtained on the photosensitive layer 22. More serious degradations of such illumination parameters may therefore be tolerated so as to improve other illumination parameters in return.

The dependency of the weighting factors $w_1, \ldots, w_m$ on the mask may in this case be specified so that different sets $\vec{w}$ of weighting factors $w_1, \ldots, w_m$ are assigned to particular mask types. For imaging a mask to be imaged, the operator of the projection exposure apparatus 10 will then select a mask type which most closely resembles the mask to be imaged, and select the set $\vec{w}$ of weighting factors $w_1, \ldots, w_m$ which is assigned to this mask type. Deliberate adaptation of the weighting factors to different mask type therefore leads not necessarily to an overall "better" approximation of the actual illumination parameters to the target parameters according to Equation (2), but rather to a kind of "redistribution" of the deviations so that they can be tolerated better.

Adaptation of the weighting factors to a mask to be imaged may, however, be carried out specifically for individual situations by the operator of the projection exposure apparatus 10. In this case the mask is not (only) assigned to a particular mask type, rather the weighting factors are determined in a way which is tailored directly to the mask to be imaged. Here, the operator thus does not influence the manipulators M1 to M7 directly by specifying control commands, but instead influences merely the weighting factors $w_1, \ldots, w_m$ for the individual illumination parameters. From this the computer 80 of the control unit 78 calculates control commands for the manipulators M1 to M7, which contribute to best possible imaging of the mask.

The weighting factors may also be determined by taking into account the imaging properties of the projection objective 20 which images the mask 14. For example, certain projection objectives may react particularly sensitively to telecentricity errors, for which reason illumination parameters that directly or indirectly relate to telecentricity errors should correspondingly be weighted more highly.

Very generally, it is preferable for the operator of the projection exposure apparatus 10 to have the opportunity to be able to determine the weighting factors freely in the control unit 78 of the illumination system 12, at least within certain limits. It is then also possible to take into account quantities and influences other than those mentioned above from the overall imaging process.

Improvement by Iterative Readjustment

The linear relationship assumed in equation Eq. (1) between the control commands $\vec{x}$ and the illumination parameters $\vec{p}$ is satisfied only approximately for real illumination systems 12. Inaccuracies may furthermore arise when determining the sensitivity matrix $\tilde{S}$, owing to measurement errors etc.

In order to reduce these error sources, the control commands $\vec{x}$, which have been obtained by minimising the expression specified in (3), may be subjected to a subsequent check by measurement techniques. To this end, the manipulators M1 to M7 are driven with the control commands $\vec{x}$. In the event that there are intolerable deviations of the illumination parameters $\vec{p}$ obtained from the measured illumination angle distribution, from the target illumination parameters $\vec{p}_0$, the manipulators M1 to M7 will be readjusted. This process is repeated until the control commands $\vec{x}$ practically no longer change, i.e. they satisfy a threshold value criterion or a sign change criterion. Such an iterative method ensures that the control commands are modified until measurements reveal that the illumination parameters $\vec{p}$ have approximated the target illumination parameters $\vec{p}_0$ as closely as possible in the sense of the minimisation criteria specified in (2) or (3).

(f) Applying the Control Commands

In a step S6 the control commands determined in step S5 are applied to the optical elements, or to the manipulators M1 to M7 used for adjusting them. According to the adjustment algorithm used in step S5, the manipulators M1 to M7 are driven so that the illumination angle distribution actually achieved is as similar as possible to the target illumination distribution defined by the target illumination parameters.

(g) Illuminating the Mask

With the illumination angle distribution set up in this way, the mask 14 is finally illuminated in a step S7 and imaged onto the photosensitive layer 22.

It is to be understood that the sequence of the steps S1 to S7 as indicated above is not mandatory. In particular, the steps S1 to S4 may be interchanged with one another in any desired way.

6. Variants of the Method

Further exemplary embodiments of an adjustment algorithm will be described below as variants of the method explained above with the aid of FIGS. 4 and 5.

6.1 Field Dependencies

Figure 5:
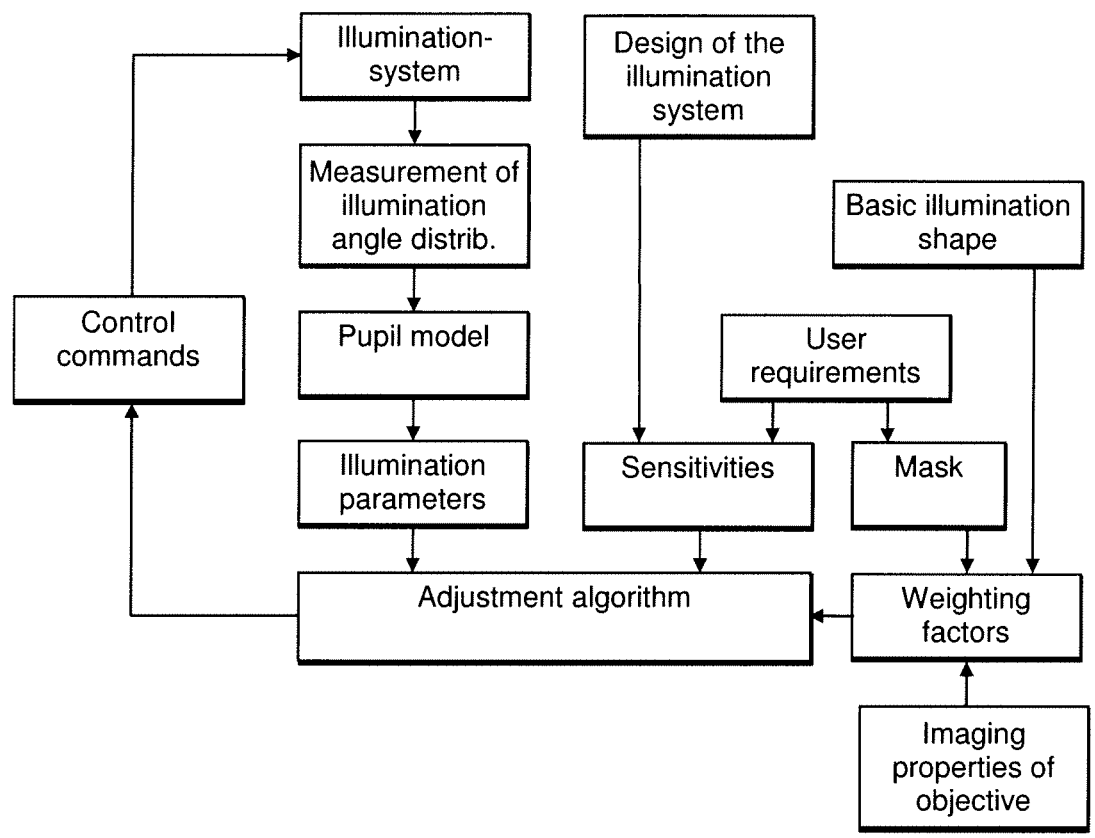
FIG. 5 shows a diagram which presents essential quantities of the method represented as a flowchart in FIG. 4, according to a first exemplary embodiment.
Figure 6:
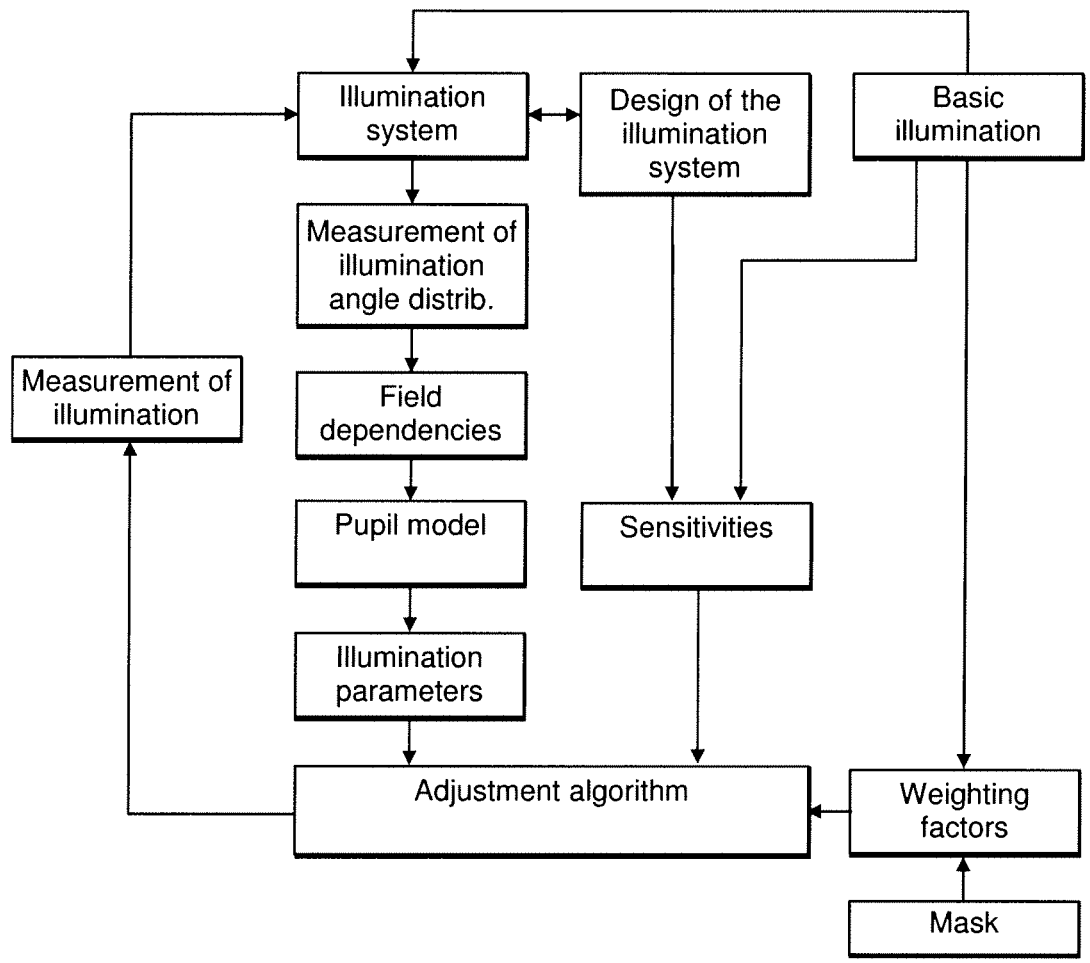
FIG. 6 shows a diagram corresponding to FIG. 5 according to a second exemplary embodiment.

FIG. 6 shows essential quantities of the adjustment algorithm in a representation derived from FIG. 5, according to a variant in which it is assumed that the illumination parameters $\vec{p}$ are not constant inside the illumination field 16 illuminated on the mask 14, but instead vary locally. Such a variation, also referred to as field dependency, may be taken into account by having the individual illumination parameters depend on the field coordinates i.e. the position on the mask 14, i.e. $\vec{p} = \vec{p}(x, y)$ where $(x, y)$ are the coordinates of a field point in the mask plane 58. The functional dependency of the illumination parameters on the field coordinates may, for example, be approximated by a polynomial expansion. The minimisation of the expressions (2) or (3), performed in step S5, is then preferably carried out so that an equally good approximation to the target illumination parameters is obtained on average for all field coordinates. In the event that for certain masks, for instance, some regions on the mask react less sensitively to deviations from the target illumination parameters, individual regions on the mask may also be weighted by additional weighting factors.

6.2 Setting Dependency of the Sensitivities

With certain models for describing the illumination angle distribution, it may be expedient to determine the sensitivity matrix $\tilde{S}$ separately for different basic shapes of the intensity distribution in a pupil surface. For example, it is feasible to distinguish between circular disc-shaped, ring-shaped and multi-pole basic shapes and to determine separate sensitivity matrices $\tilde{S}_{BS\,BS}$ for these basic shapes.

6.3 Setting Dependency of the Weighting Factors

If the manipulators M1 to M7 can be adjusted when changing the basic illumination shape, then in the exemplary embodiment explained with the aid of the diagram in FIG. 6 not only the sensitivity matrix $\tilde{S}_{BS\,BS}$ adapted to this basic shape, but also a weighting vector $\vec{w}_{SB}$ which has likewise been specially determined for this basic illumination shape, will be used for the minimisation of the expression (3). Optimal driving of the manipulators M1 to M7 is thereby achieved for each basic illumination shape.

The number of basic illumination shapes, for which a sensitivity matrix $\tilde{S}_{BS}$ adapted thereto and weighting factors $\vec{w}_{SB}$ adapted thereto can be determined beforehand, is limited. Precisely with new types of target illumination angle distributions, the desire may therefore arise to determine sensitivities and weighting factors for the eventuality that the target illumination angle distribution does not correspond to any of the basic illumination shapes for which sensitivity matrices $\tilde{S}_{BS}$ adapted thereto and weighting factors adapted thereto have been found.

The simplest solution in this situation consists in selecting that basic illumination shape which corresponds most closely to the target illumination angle distribution. As an alternative to this, basic illumination shapes as well as the sensitivity matrices $\tilde{S}_{BS}$ and weighting factors $\vec{w}_{SB}$ found for them may be interpolated. In this case that sensitivity matrix $\tilde{S}_{BS}$ and those weighting factors $\vec{w}_{SB}$, which correspond to an interpolated basic shape that corresponds most closely to the desired target illumination angle distribution, will be used in the adjustment algorithm.

6.4 Vector Zernike Pupil Model

Figure 7:
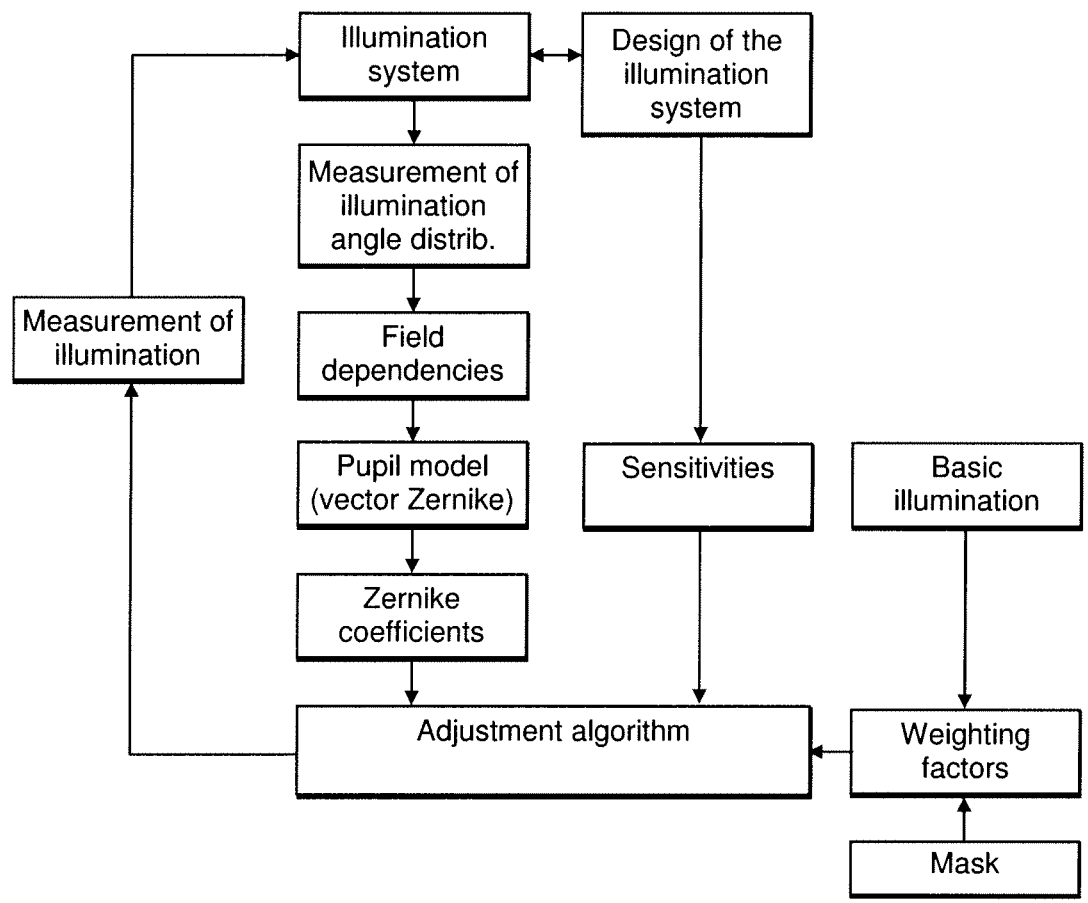
FIG. 7 shows a diagram corresponding to FIG. 5 according to a third exemplary embodiment.

A special pupil model will be presented below which is particularly highly suitable for describing intensity distributions of light bundles, assigned to individual field points, in an exit pupil. As may be seen in the diagram of FIG. 7, the sensitivity matrix $\vec{S}$ in this pupil model may be independent of the selected basic illumination shape. This is an important advantage in so far as determining sensitivities for different basic illumination shapes is very computer-intensive in the case of simulation, and very time-consuming in the case of measurement. When this pupil model is employed, the basic illumination shape then affects only the weighting factors $\vec{w}$.

Figure 8:
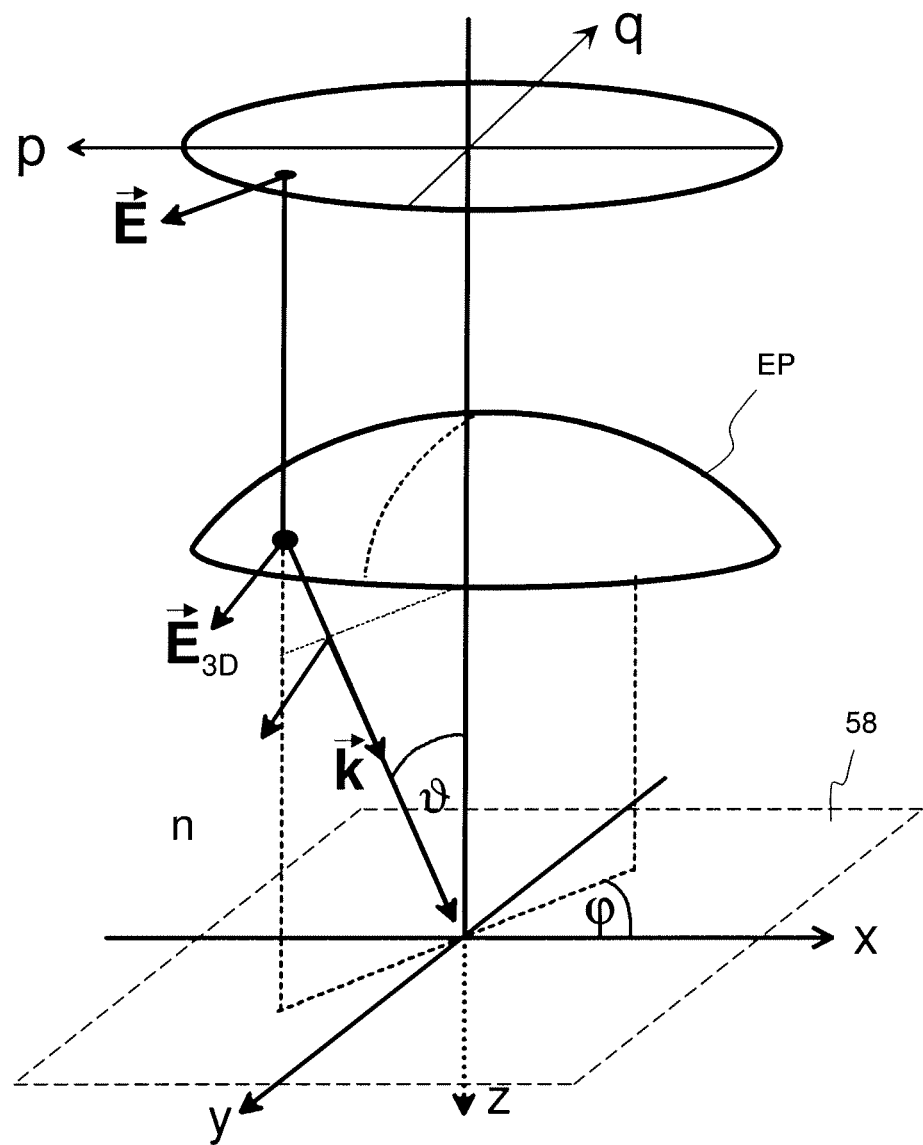
FIG. 8 shows an illustration to clarify the geometrical relationships between the exit pupil and the image plane.
Figure 9A:
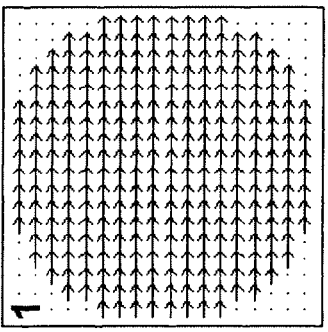
FIGS. 9a to 9h show graphs in which vector Zernike polynomials are plotted for order numbers 1 to 8.
Figure 9B:
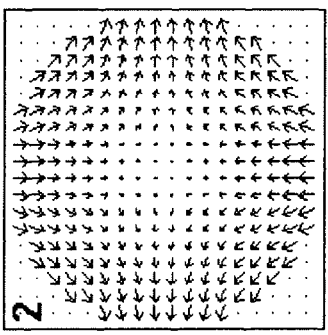
Figure 9C:
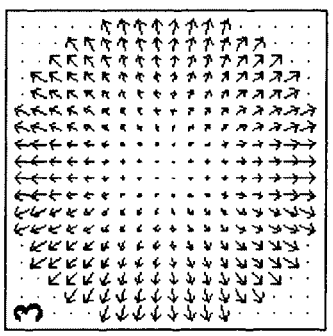
Figure 9D:
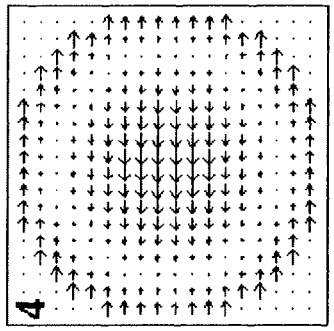
Figure 10A:
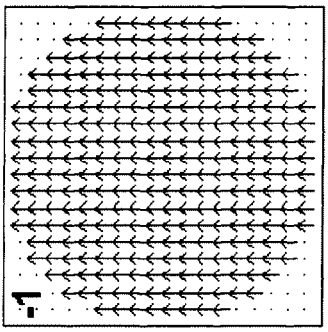
FIGS. 10a to 10h show graphs in which vector Zernike polynomials are plotted for order numbers −1 to −8.
Figure 10B:
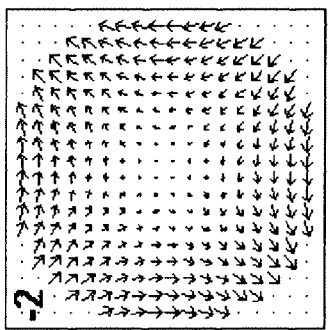
Figure 10C:
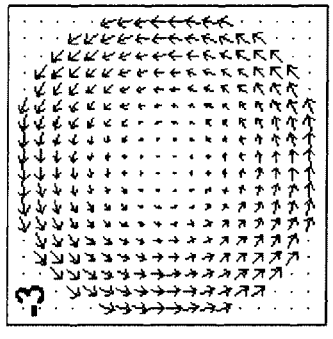
Figure 10D:
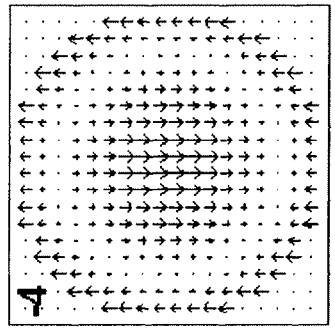
Figure 9H:
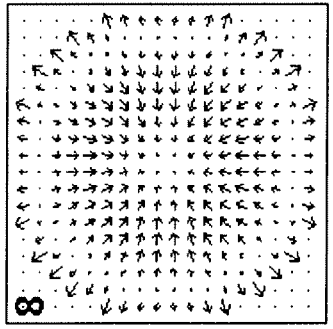
Figure 10H:
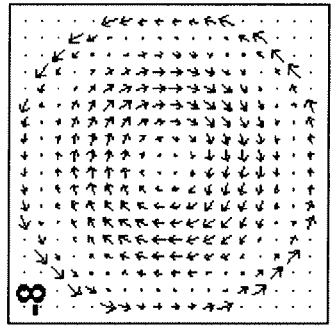
Figure 9G:
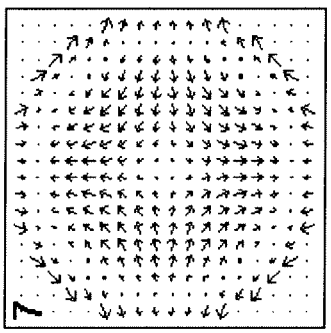
Figure 10G:
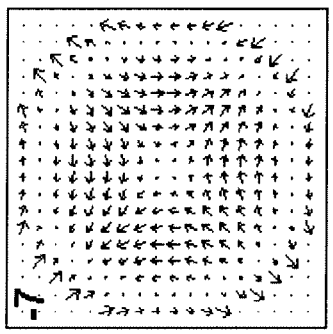
Figure 9F:
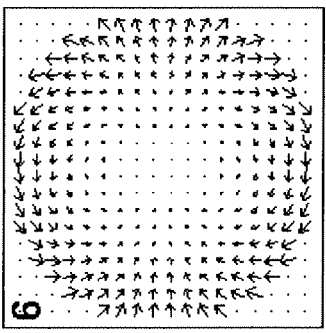
Figure 10F:
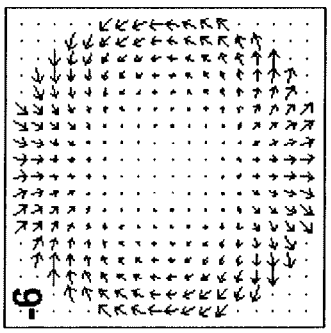
Figure 9E:
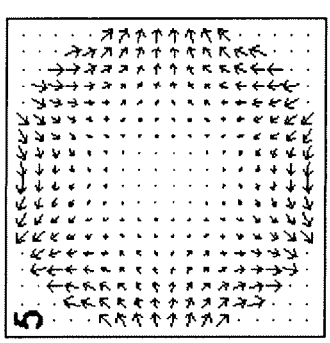
Figure 10E:
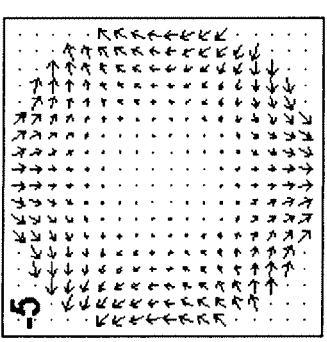

In order to explain the pupil model referred to below as the vector Zernike model, reference will first be made to FIG. 8. This shows the geometrical relationships between a surface, referred to here as a generalised pupil EP, and the mask plane 58. The generalised pupil concept is used in particular when the exit pupil of an optical system lies at infinity, as is the case with telecentric field diaphragm objectives 56. In order to avoid having to deal with quantities lying at infinity, the physical conditions in the exit pupil are described in the generalised pupil. This is a kind of substitute pupil, which is geometrically similar to the exit pupil but has a finite radius and lies in the image space. Since the angles arising in the generalised pupil coincide with those in the exit pupil, for problems in which it is only the angles occurring that are important, the physical conditions in the exit pupil may be described equally well in the generalised pupil. The generalised pupil concept is explained in more detail in an article by C. W. McCutchen entitled "*Generalized aperture and the three-dimensional diffraction image*", Journal of the Optical Society of America, volume 54 (1964), pages 240-244.

Field diaphragm objectives of illumination systems of microlithographic projection exposure apparatus satisfy the sine condition with high accuracy. The generalised pupil EP for a particular image point therefore has the shape of a sphere surface, at the centre of which the relevant field point in the illumination field 16 lies. Although the exit pupil will still be referred to below for the sake of simplicity, the mathematical description does however refer to the generalised pupil EP.

The electromagnetic field in the exit pupil will be regarded approximately as purely transverse, so that the electric field vector $\vec{E}_{3D}$ is perpendicular to the bundle direction. In general, however, it is sufficient for the vector of the electric field strength $\vec{E}$ to be considered merely as a two-dimensional quantity which has the following form:

$$\vec{E}(p, q) = \begin{pmatrix} \tilde{E}_x(p, q) \\ \tilde{E}_y(p, q) \end{pmatrix} \quad (4)$$

Here, $\tilde{E}_x$ and $\tilde{E}_y$ denote the complex components of the electric field strength $\vec{E}$. Dimensionless pupil coordinates for positions $\vec{\sigma}$ in the exit pupil are denoted by p, q:

$$\vec{\sigma} = \begin{pmatrix} p \\ q \end{pmatrix} \quad (5)$$

The pupil coordinates p, q are related to the propagation angles in the image space as follows:

$$p = n \sin\theta \cos\phi$$

$$q = n \sin\theta \sin\phi \quad (6)$$

The refractive index of the medium, which fills the image space in and immediately before the mask plane 58, is denoted here by n.

With $k_0 = 2\pi/\lambda_0$, the propagation vector of a plane wave at the pupil point $\vec{\sigma}$ then reads $$\vec{k} = k_o \begin{pmatrix} p \\ q \\ m \end{pmatrix}, \quad (7)$$

where $$m = \sqrt{n^2 - p^2 - q^2}. \quad (8)$$

Let an ideal intensity $P_0$ at the pupil position $\vec{\sigma}$ for a target intensity distribution in the exit pupil be given by $P_0(\vec{\sigma})$. In the pupil model described here, a perturbation of the illumination angle distribution is characterised by two functions $\vec{T}(\vec{\sigma})$ and $M(\vec{\sigma})$. The function $\vec{T}(\vec{\sigma})$ represents a coordinate transformation, which may be regarded intuitively as a distortion, and the function $M(\vec{\sigma})$ describes an additional intensity modulation of the exit pupil. The real (perturbed) intensity distribution $P(\vec{\sigma})$ in the exit pupil can then be represented as $$P(\vec{\sigma}) = M(\vec{\sigma}) \cdot \frac{1}{\det\left(\frac{\partial \vec{T}}{\partial \vec{\sigma}}\right)} \cdot P_0(\vec{T}(\vec{\sigma})) \quad (9)$$

or more simply as $$P(\vec{\sigma}) = M'(\vec{\sigma}) \cdot P_0(\vec{T}(\vec{\sigma})),$$

if the scalar normalisation $1/\det(\partial \vec{T}/\partial \vec{\sigma})$ is combined with the function $M(\vec{\sigma})$.

Both the vector function $\vec{T}(\vec{\sigma})$ and the scalar function $M(\vec{\sigma})$ are now approximated as a superposition of functions of a complete, preferably orthogonal system of basis function. The function $M(\vec{\sigma})$ may, for example, be approximated by a sum of Zernike polynomials in the form $$M(\vec{\sigma}) = 1 + \sum_{k=1}^{\infty} \alpha_k \cdot U_k(\vec{\sigma}), \quad (10)$$

where $U_k(\vec{\sigma})$ are the conventional Zernike polynomials.

The coordinate transformation $\vec{T}(\vec{\sigma})$ may be parameterised by the following vector Zernike decomposition:

$$\vec{T}(\vec{\sigma}) = \vec{\sigma} + \sum_{k=-\infty, k \neq 0}^{\infty} \beta_k \cdot \vec{W}_k(\vec{\sigma}). \quad (11)$$

The vector Zernike polynomials $\vec{W}_k(\vec{\sigma})$ are given by $$\vec{W}_k(\vec{\sigma}) = R_n^m \vec{\Phi}_{m\epsilon}, \tag{12}$$

where $R_n^m$ is the radial component of a $k^{th}$ order Zernike polynomial, $\vec{\Phi}_{m\epsilon}$ is given by $$\vec{\Phi}_{m\epsilon} = \begin{pmatrix} \cos(\epsilon\pi/2) & -\sin(\epsilon\pi/2) \\ \sin(\epsilon\pi/2) & \cos(\epsilon\pi/2) \end{pmatrix} \begin{pmatrix} \cos m\varphi \\ -\sin m\varphi \end{pmatrix} \tag{13}$$

and the order number k is linked to n, m and $\epsilon$ through the following table

| k | 1 | -1 | 2 | -2 | 3 | -3 | 4 | -4 | 5 | -5 | 6 | -6 |
|---|---|----|---|----|---|----|---|----|---|----|---|----|
| n | 0 | 0 | 1 | 1 | 1 | 1 | 2 | 2 | 2 | 2 | 2 | 2 |
| m | 0 | 0 | 1 | 1 | -1 | -1 | 0 | 0 | 2 | 2 | -2 | -2 |
| $\epsilon$ | 0 | 1 | 0 | 1 | 0 | 1 | 0 | 1 | 0 | 1 | 0 | 1 | etc.

The vector Zernike polynomials with the order numbers 1 to 8 and −1 to −8 are graphically represented in FIGS. 9a to 9h and 10a to 10h, respectively. The terms "1" and "−1" correspond to a geometrical x or y telecentricity, and the terms "2" and "−2" represent a geometrical HV or ST ellipse. The term "3" corresponds to an enlargement of the pupil, "−3" corresponds to a rotation of the pupil etc.

Since the basis functions, on which the two decompositions according to Eqs (10) and (11) are based, form a complete function system, any desired real intensity distribution in an exit pupil assigned to a particular field point can be described by specifying an (arbitrary) ideal intensity distribution $P_0(\vec{\sigma})$ and the superposition coefficients $\alpha_k$ and $\beta_k$, the superposition coefficients $\alpha_k$ and $\beta_k$ describing the perturbation with respect to the ideal intensity distribution $P_0(\vec{\sigma})$. It is in this case unimportant whether the real intensity distribution $P(\vec{\sigma})$ itself is described by another parametric model or by a sufficiently large number of measurement values. In both cases, the superposition coefficients $\alpha_k$ and $\beta_k$ represent illumination parameters which can be used according to the method described in section 5 to determine control commands for the manipulators M1 to M7, so that the intensity distribution actually obtained in the exit pupil resembles the desired target intensity distribution as closely as possible.

Since any desired intensity distributions in exit pupils can be described by the vector Zernike pupil model with an accuracy which in the end is freely selectable, it is actually sufficient to determine the sensitivity matrix $\tilde{S}$ only once for the basis functions assigned to the superposition coefficients $\alpha_k$ and $\beta_k$. Similarly as described above in 5(c), to this end for example it is possible to measure how the adjustment of an optical element, generated by a manipulator, affects the various basis functions. A sensitivity matrix $\tilde{S}$ obtained in this way can then be used for any desired basic illumination shape. This obviates the outlay on determining the sensitivity matrices for different basic illumination shapes.

Another advantage of using the vector Zernike pupil model is that the description of the intensity distribution in the exit pupil, as a perturbation of an ideal intensity distribution, makes it possible to give the individual superposition coefficients $\alpha_k$ and $\beta_k$ a meaning which is immediately intuitive in many cases. The superposition coefficients $\alpha_k$ and $\beta_k$ can therefore be employed not only in conjunction with the driving of the manipulators M1 to M7, but also very generally for evaluating illumination angle distributions. If, for example, a calculation for a particular illumination system 12 and a diffractive optical element 36 reveal that the superposition coefficient $\alpha_{-3}$ is significantly different from zero in a dipole illumination, then this can be interpreted intuitively as a rotation of the two poles about the optical axis.

Such an evaluation may also be used advantageously for producing illumination systems. For example a quality function may be established, to which at least one of the superposition coefficients contributes. Starting from an original design for the illumination system, the design may then be modified until the quality function is improved or until no further improvement takes place.

By additional adjustment steps after production and before delivery, an illumination system may be improved further in respect of the illumination angle distributions which can be set up. To this end, the illumination angle distribution may initially be evaluated in the manner indicated. By adjustment steps, for example slight translational displacement or tilting of particular optical elements, the illumination angle distribution may then be modified so that the evaluation is improved.

In the finished illumination system, the superposition coefficients $\alpha_k$ and $\beta_k$ may for example be used to make predictions for new basic illumination shapes in the scope of simulations. The fact that many of the superposition coefficients $\alpha_k$ and $\beta_k$ have an intuitive meaning then significantly facilitates the work of the developer who is carrying out the simulation.

Owing to the possibility of specifying weighting factors for the individual illumination parameters (i.e. the superposition coefficients $\alpha_k$ and $\beta_k$), here again the illumination system 12 overall may be optimised in the form of a "compromise" between a large number of different basic illumination shapes and mask types. As an alternative to this, it is possible to specify different weighting factors as a function of the basic illumination shape. Furthermore, if desired, the weighting factors may also be determined here as a function of the mask 14 to be imaged.

Instead of the decompositions specified in Eqs (10) and (11), decompositions may also be carried out based on other complete, preferably orthogonal systems of basis functions. For the function $\vec{T}(\vec{\sigma})$, for example, a decomposition into vector modes according to $$\vec{T}(\vec{\sigma}) \approx \vec{\sigma} + \sum_{j=-N}^{N} \tilde{Z}_j \vec{V}_j(\vec{\sigma}), \tag{14}$$

may be envisaged. The vector modes $\vec{V}_j(\vec{\sigma})$ are in this case given by $$\vec{V}_{+j} = \begin{pmatrix} U_j(\vec{\sigma}) \\ 0 \end{pmatrix}, \vec{V}_{-j} = \begin{pmatrix} 0 \\ U_j(\vec{\sigma}) \end{pmatrix} \tag{15}$$

where $\vec{V}_{+j}$ is a vector mode for positive j, $\vec{V}_{-j}$ is a vector mode for negative j and $U_j(\vec{\sigma})$ are again the conventional $j^{th}$ order Zernike polynomials.

Methods, with which the superposition coefficients $\alpha_k$ and $\beta_k$ can be determined by measurement techniques, will be described below:

6.4.1 Fitting

In this method different basic illumination shapes, the idealised intensity distribution $P_0(\vec{\sigma})$ of which is known, are set up in the illumination system 12. For each basic illumination shape, the actual intensity distribution in the exit pupil is measured. Now, for each basic illumination shape, the superposition coefficients $\alpha_k$ and $\beta_k$ can be determined by fitting. It will be noted that the ideal intensity distribution $P_0(\vec{\sigma})$, which goes into Eq. (9), always stays the same and may for example correspond to one of the basic illumination shapes, although it does not have to.

Repetition of the measurement and fitting steps for different basic illumination shapes is desirable because certain superposition coefficients occur only in selected basic illumination shapes. For instance the rotation shown in FIG. 10c, which is described by the superposition coefficients $\beta_{-3}$, is not measurable in rotationally symmetric basic illumination shapes although certain manipulators M1 to M7 may possibly generate such a rotation. Only when a non-rotationally symmetric basic illumination shape is set up can the superposition coefficient $\beta_{-3}$ be determined.

Since the number of basic illumination shapes which can be measured is limited, in principle it is actually possible to determine only a subset of the superposition coefficients $\alpha_k$ and $\beta_k$. Above all for new types of basic illumination shapes which differ significantly from the measured basic illumination shapes, it is therefore only limitedly possible to draw conclusions about the actual illumination angle distribution which can be set up in the mask plane 58 by the manipulators M1 to M7.

6.4.2 Use of a Grating

In this method the diffractive optical element 36 is replaced by a diffraction grating, which is constructed particularly simply but owing to its simplicity can be manufactured very accurately. During manufacture, for example, a chromium layer which has been vapour deposited on a support material may be structured with the aid of lithographic methods. The position of the diffraction orders of the grating in the exit pupil and the relative intensity of the individual diffraction orders can be predicted very accurately with the aid of simulations.

If the intensity distribution in the exit pupil is now measured for one or more field points, then the superposition coefficients $\beta_k$ can be determined from the actual position of the diffraction orders while the relative intensity of the diffraction orders, compared with the theoretically expected values, gives the superposition coefficients $\alpha_k$.

This method may be employed similarly in an illumination system which adjusts the illumination angle distribution via a diaphragm arranged in a pupil surface. Only the sections of the diffraction orders which are let through by the diaphragm then appear in the exit pupil.

In contrast to the method described in 6.4.1, in principle all the superposition coefficients $\alpha_k$ and $\beta_k$ can be determined with the aid of such a grating. It is therefore possible to predict better how an illumination system 12 will react to entirely new combinations of control commands, and including those combinations of control commands which correspond to entirely new types of basic illumination shapes which were not known when configuring the illumination system 12.

6.5 Adaptation of the Mask

Under certain circumstances, the desired illumination angle distribution may not be achieved in the mask plane 58 despite optimal adjustment of the manipulators M1 to M7. Reasons for this may inter alia be undesired field dependencies of the superposition coefficients $\alpha_k$ and $\beta_k$, for which in general there are no possibilities of correction.

Describing the intensity distribution in the exit pupil with the aid of the vector Zernike pupil model, however, allows the uncorrectable deviations from the ideal illumination angle distribution to be taken into account when configuring the mask 14. In the case of a field-dependent illumination angle distribution, this may for example be done by structures of the same type on the mask being position-dependently designed differently so as to compensate in some degree for the different illumination angle distributions at these positions.

What is claimed is:

1. A method, comprising:
   a) determining a set of illumination parameters that describe properties of a light bundle configured to converge at a point on a mask to be illuminated by an illumination system of a microlithographic projection exposure apparatus, the properties of the light bundle comprising an intensity distribution of the light bundle at an exit pupil associated with the point on the mask;
   b) describing the intensity distribution of the light bundle at the exit pupil as a perturbation of an ideal intensity distribution;
   c) describing the perturbation as a combination of an intensity modulation and a distortion, wherein the intensity modulation is described as a superposition of basis functions of a first complete function system, and the distortion is described as a superposition of basis functions of a second complete function system;
   d) determining optical elements of the illumination system whose optical effect on the illumination parameters can be modified based on control commands;
   e) for each optical element and for at least some functions of the first complete function system and for at least some functions of the second complete function system, determining sensitivities with which the illumination parameters react to an adjustment induced by the control commands;
   f) determining the control commands, while taking into account the sensitivities determined in e), such that deviations of the illumination parameters from a target set of illumination parameters satisfy a predetermined minimisation criterion;
   g) applying the control commands determined in f) to the optical elements; and
   h) illuminating the mask.

2. The method according to claim 1, wherein a linear relationship between the control commands and the illumination parameters is used.

3. The method according to claim 2, wherein the linear relationship is given by $\vec{p}=\vec{x}\cdot\vec{S}$, where $\vec{p}=(p_1, p_2, \ldots, p_m)$ denotes the set of illumination parameters $p_1, p_2, \ldots, p_m$, $\vec{S}$ the sensitivities determined in e), and $\vec{x}$ denotes a set of control commands.

4. The method according to claim 1, wherein the sensitivities are determined in e) by simulations or by measurements.

5. The method according to claim 1, wherein the control commands are determined in f) by an iterative method in which the control commands are modified until measurements reveal that the deviations of the illumination parameters from the target set of illumination parameters satisfy the predetermined minimisation criterion.

6. The method according to claim 1, wherein the illumination parameters are weighted through multiplication by weighting factors.

7. The method according to claim 6, wherein the weighting factors depend on a general mask type or on the mask to be illuminated.

8. The method according to claim 6, wherein the weighting factors are determined while taking into account imaging properties of a projection objective which images the mask.

9. The method according to claim 1, wherein the intensity distribution is described as a function $P(\vec{\sigma})$ of pupil coordinates $\vec{\sigma}=(\sigma_x,\sigma_y)$, which is given by $$P(\vec{\sigma}) \propto M(\vec{\sigma}) \cdot P_0(\vec{T}(\vec{\sigma})),$$

where $M(\vec{\sigma})$ denotes the intensity modulation, $\vec{T}(\vec{\sigma})$ denotes the distortion and $P_0(\vec{\sigma})$ denotes the ideal intensity distribution.

10. The method according to claim 9, wherein the intensity modulation $M(\vec{\sigma})$ is given by a linear superposition of functions of the first complete function system.

11. The method according to claim 10, wherein the intensity modulation $M(\vec{\sigma})$ is given by $$M(\vec{\sigma}) = 1 + \sum_{k=1}^{\infty} \alpha_k \cdot U_k(\vec{\sigma}),$$

where $U_k(\vec{\sigma})$ are Zernike polynomials and $\alpha_k$ are Zernike coefficients.

12. The method according to claim 11, wherein, in order to determine the Zernike coefficients $\alpha_k$ and the vector Zernike coefficients $\beta_k$, an intensity distribution in the exit pupil is measured and compared with an ideal intensity distribution, which is similar to the measured intensity distribution, and wherein the Zernike coefficients $\alpha_k$ and the vector Zernike coefficients $\beta_k$ are determined by fitting to the measured intensity distribution.

13. The method according to claim 12, wherein a diaphragm is arranged in a pupil surface of the illumination system during the measurement of the intensity distribution in the exit pupil.

14. The method according to claim 12, wherein a diffraction pattern is generated in a pupil surface of the illumination system by a grating during the measurement of the intensity distribution in the exit pupil.

15. The method according to claim 12, wherein the measurement of the intensity distribution and the fitting are carried out for a plurality of different ideal intensity distributions.

16. The method according to claim 9, wherein the distortion $\vec{T}(\vec{\sigma})$ is given by linear superposition of vector modes of the second complete function system.

17. The method according to claim 16, wherein components of the vector modes are Zernike polynomials.

18. The method according to claim 16, wherein only one component of each vector mode is non-zero.

19. The method according to claim 16, wherein the distortion $\vec{T}(\vec{\sigma})$ is given by $$\vec{T}(\vec{\sigma}) = \vec{\sigma} + \sum_{k=-\infty, k \neq 0}^{\infty} \beta_k \cdot \vec{W}_k(\vec{\sigma}),$$

wherein $\vec{W}_k(\vec{\sigma})$ are vector Zernike polynomials and $\beta_k$ are vector Zernike coefficients.

20. The method according to claim 19, wherein the vector Zernike polynomials $\vec{W}_k(\vec{\sigma})$ are given by $$\vec{W}_k(\vec{\sigma}) = R_n^m \vec{\Phi}_{m\epsilon},$$

where $R_n^m$ is the radial component of a $k^{th}$ order Zernike polynomial and $\vec{\Phi}_{m\epsilon}$ is given by $$\vec{\Phi}_{m\epsilon} = \begin{pmatrix} \cos(\epsilon\pi/2) & -\sin(\epsilon\pi/2) \\ \sin(\epsilon\pi/2) & \cos(\epsilon\pi/2) \end{pmatrix} \begin{pmatrix} \cos m\varphi \\ -\sin m\varphi \end{pmatrix}$$

and the order number k is linked to n, m and $\epsilon$ through the following table

| k | 1 | −1 | 2 | −2 | 3 | −3 | 4 | −4 | 5 | −5 | 6 | −6 |
|---|---|---|---|---|---|---|---|---|---|---|---|---|
| n | 0 | 0 | 1 | 1 | 1 | 1 | 2 | 2 | 2 | 2 | 2 | 2 |
| m | 0 | 0 | 1 | 1 | −1 | −1 | 0 | 0 | 2 | 2 | −2 | −2 |
| $\epsilon$ | 0 | 1 | 0 | 1 | 0 | 1 | 0 | 1 | 0 | 1 | 0 | 1. |

21. The method of claim 1, wherein the optical elements are selected from a group consisting of:
- a light source whose position relative to an optical axis of the illumination system can be modified;
- a diffractive optical element whose spatial orientation with respect to the optical axis of the illumination system can be modified;
- a zoom objective that contains at least one lens which can be displaced along the optical axis;
- an axicon group that contains two axicon elements whose spacing can be modified;
- a transmission filter which is arranged in or in a vicinity of a pupil surface of the illumination system;
- a transmission filter which is arranged in or in a vicinity of a field plane of the illumination system;
- a transmission filter which is arranged between a pupil surface and a field plane of the illumination system; and
- a variable-position lens that is arranged in a condenser of the illumination system, by which ray bundles coming from secondary light sources are superimposed in a field plane.

22. The method according to claim 1, wherein the illumination parameters are determined in a) so that they are input quantities of a simulation program with which it is possible to calculate quantities that, for a particular mask, relate to an arrangement and dimensions of structures which can be generated by imaging the mask on a support.

23. A method, comprising:
a) determining a set of illumination parameters that describe properties of a light bundle configured to converge at a point on a mask to be illuminated by an illumination system of a microlithographic projection exposure apparatus, the properties of the light bundle comprising an intensity distribution of the light bundle at an exit pupil associated with the point on the mask;

b) measuring the intensity distribution in the exit pupil of the illumination system which is assigned to the point on the mask;
c) at least approximately describing the intensity distribution measured in b) as a perturbation of an ideal intensity distribution, the perturbation being described as a combination of an intensity modulation and a distortion, wherein
the intensity modulation is described by a linear superposition of functions of a first complete function system, and
the distortion is described by a linear superposition of vector modes of a complete second function system;
d) evaluating the properties of the light bundle based on scalar superposition coefficients of the linear superpositions;
e) determining optical elements of the illumination system whose optical effect on the illumination parameters can be modified based on control commands;
f) for each optical element, determining sensitivities with which the illumination parameters react to an adjustment induced by the control commands;
g) determining the control commands, while taking into account the sensitivities determined in f), such that deviations of the illumination parameters from a target set of illumination parameters satisfy a predetermined minimisation criterion;
h) applying the control commands determined in g) to the optical elements; and
i) illuminating the mask.

24. The method according to claim 23, wherein the intensity distribution is described as a function $P(\vec{\sigma})$ of pupil coordinates $\vec{\sigma} = (\sigma_x, \sigma_y)$, which is given by $$P(\vec{\sigma}) \propto M(\vec{\sigma}) \cdot P_0(\vec{T}(\vec{\sigma})),$$

where $M(\vec{\sigma})$ denotes the intensity modulation, $\vec{T}(\vec{\sigma})$ denotes the distortion and $P_0(\vec{\sigma})$ denotes the ideal intensity distribution.

25. The method according to claim 23, further comprising:
determining a quality function to which at least one of the superposition coefficients determined in c) contributes; and
providing a modified design of the illumination system such that the quality function is improved.

26. The method according to claim 23, further comprising modifying the properties such that the evaluation according to d) is improved.

27. The method according to claim 26, wherein the properties are modified with the aid of an optical element whose optical effect on the properties can be modified as a function of control commands.

28. The method according to claim 27, wherein the optical element is driven when a magnitude of at least one superposition coefficient exceeds a predetermined value.

29. The method according to claim 23, further comprising determining structures contained on the mask while taking the superposition coefficients into account, so as to reduce undesired effects on the imaging of the mask which are caused by at least one non-zero superposition coefficient.

30. The method according to claim 29, wherein a field dependency of the superposition coefficients is taken into account.

31. A system which is specified by the scalar superposition coefficients determined by the method according to claim 23, wherein the system is an illumination system of a microlithographic projection exposure apparatus.

32. The method of claim 23, wherein the first complete function system is an orthogonal function system.

33. The method of claim 32, wherein the second complete function system is an orthogonal function system.

34. An apparatus, comprising:
an illumination system comprising a plurality of optical elements whose optical effect on the illumination parameters can be modified based on control commands,
a measuring instrument configured to measure an intensity distribution in an exit pupil assigned to a point that lies in an illumination plane, in which a mask to be illuminated can be arranged, and at which a light bundle is configured to converge, and
a computer configured to:
(i) at least approximately describing the intensity distribution measured by the measuring instrument as a perturbation of an ideal intensity distribution, the perturbation being described as a combination of an intensity modulation and a distortion, wherein
the intensity modulation is described by a linear superposition of functions of a first complete function system, and
the distortion is described by a linear superposition of vector modes of a complete second function system; and
(ii) determine, for each optical element and for at least some functions of the first complete function system and for at least some functions of the second complete function system, sensitivities with which illumination parameters, which describe properties of the light bundle, react to an adjustment, which is induced by the control commands, of the optical element, wherein the properties of the light bundle comprise an intensity distribution which the light bundle has in an exit pupil associated with the point, and
(ii) determine control commands while taking the previously determined sensitivities into account, such that deviations of the illumination parameters from target illumination parameters satisfy a predetermined minimisation criterion, and
wherein the apparatus is a microlithographic projection exposure apparatus.

35. The apparatus of claim 34, further comprising a data transfer path configured to apply the control commands determined by the computer to the optical elements.

36. A method, comprising:
a) determining a set of illumination parameters that describe properties of a light bundle configured to converge at a point on a mask to be illuminated by an illumination system of a microlithographic projection exposure apparatus, the properties of the light bundle comprising an intensity distribution of the light bundle at an exit pupil associated with the point on the mask;
b) determining optical elements of the illumination system whose optical effect on the illumination parameters can be modified based on control commands;
c) for each optical element, determining sensitivities with which the illumination parameters react to an adjustment induced by the control commands;
d) determining the control commands, while taking into account the sensitivities determined in c), such that deviations of the illumination parameters from a target set of illumination parameters satisfy a predetermined minimisation criterion;

e) applying the control commands determined in d) to the optical elements; and f) illuminating the mask, wherein the illumination parameters are weighted through multiplication by weighting factors.

37. The method according to claim 36, wherein the weighting factors depend on a general mask type or on the mask to be illuminated.

38. The method according to claim 36, wherein the weighting factors are determined while taking into account imaging properties of a projection objective which images the mask.

* * * * *

UNITED STATES PATENT AND TRADEMARK OFFICE
CERTIFICATE OF CORRECTION

Figure 4:
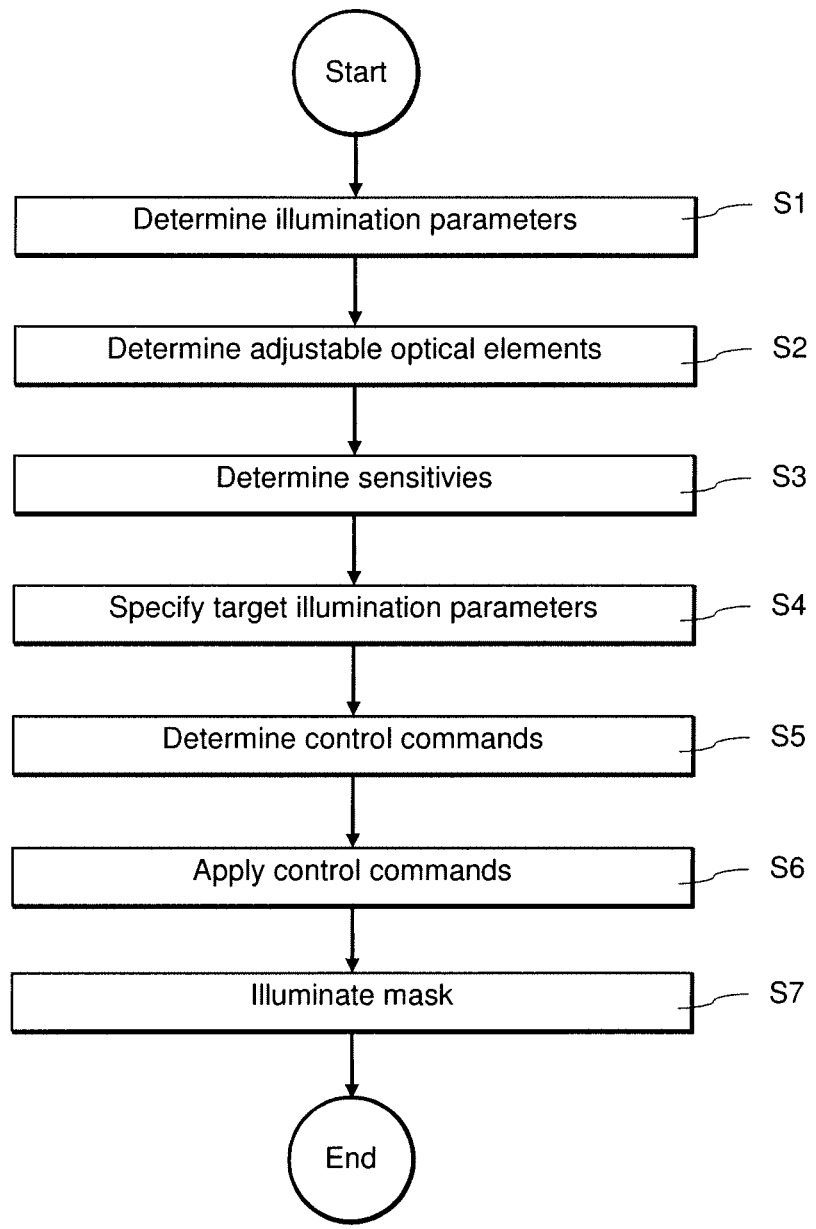
FIG. 4 shows a flowchart to explain a method according to the disclosure.

PATENT NO. : 8,467,033 B2  Page 1 of 1
APPLICATION NO. : 12/853971
DATED : June 18, 2013
INVENTOR(S) : Oliver Natt It is certified that error appears in the above-identified patent and that said Letters Patent is hereby corrected as shown below:

In the Drawings:

Sheet 4 of 10, Fig. 4, delete "sensitivies" insert -- sensitivities --;

In the Specification:

Column 1, Line 29, delete "micro structured" insert -- microstructured --;

Column 14, Line 34, delete " $\bar{\bar{S}}_{BS\,BS}$ " insert -- $\bar{\bar{S}}_{BS}$ --;

Column 14, Line 40, delete " $\bar{\bar{S}}_{BS\,BS}$ " insert -- $\bar{\bar{S}}_{BS}$ --;

Column 16, Line 1-4, after "q=n sin θ sin ϕ" insert -- . --;

In the Claims:

Column 20, Line 60, Claim 3, after " $\bar{\bar{S}}$ " insert -- denotes --;

Column 24, Line 39, Claim 34, delete "(ii)" insert -- (iii) --.

Signed and Sealed this
Eighth Day of October, 2013

Teresa Stanek Rea
*Deputy Director of the United States Patent and Trademark Office*